United States Patent [19]

Uchihira

[11] Patent Number: 5,712,824
[45] Date of Patent: Jan. 27, 1998

[54] SEMICONDUCTOR STATIC MEMORY DEVICE WITH PULSE GENERATOR FOR REDUCING WRITE CYCLE TIME

[75] Inventor: Teruyuki Uchihira, Tokyo, Japan

[73] Assignee: NEC Corporation, Tokyo, Japan

[21] Appl. No.: 631,896

[22] Filed: Apr. 16, 1996

[30] Foreign Application Priority Data

Apr. 24, 1995 [JP] Japan .................. 7-123128

[51] Int. Cl.$^6$ .......................................... G11C 7/00
[52] U.S. Cl. .............................. 365/203; 365/233.5
[58] Field of Search ............................ 365/233, 203, 365/194, 233.5

[56] References Cited

U.S. PATENT DOCUMENTS 5,029,135  7/1991  Okubo ........................ 365/233.5
5,228,003  7/1993  Tokuda ....................... 365/233.5

Primary Examiner—David C. Nelms
Assistant Examiner—Michael T. Tran
Attorney, Agent, or Firm—Whitham, Curtis, Whitham & McGinn

[57] ABSTRACT

A semiconductor memory includes a pulse signal generator which receives a clock signal and outputs a first pulse signal and a second pulse signal respectively as a digit line recovery control signal and a word line selection signal. The pulse signal generator includes a first delay circuit and a second delay circuit connected in series, the first delay circuit providing a delay time for a pulse width of the recovery control signal, and the second delay circuit together with the first delay circuit providing a delay time for a pulse width of the word line selection signal. In response to the rising of the clock, the pulse signal generator outputs the digit line recovery control signal and the word line selection signal. Using these signals, digit line recovery is started immediately after cell node inversion during a write operation and word line is rendered non-selected after cell node is stabilized. It is possible to reduce the write cycle time by the extent corresponding to an overlap of the word line selection time and the digit line level recovery time, thus enabling the semiconductor memory to operate fast.

2 Claims, 4 Drawing Sheets

SEMICONDUCTOR STATIC MEMORY DEVICE WITH PULSE GENERATOR FOR REDUCING WRITE CYCLE TIME

BACKGROUND OF THE INVENTION

(1) Field of the Invention

The present invention relates to semiconductor memories, and more particularly to fast operating semiconductor static memories.

(2) Description of the Related Art

A prior art semiconductor memory of the type to which the present invention relates, has a word line which is caused to be held at raised level for a predetermined width in synchronization with a clock signal. After a write operation, potential on a pair of digit lines connected to a pertinent memory cell is forcibly pulled up to a state before the write operation, i.e., usually to a supply voltage (Vcc) to be ready for the next read or write operation.

The semiconductor memory having this feature will now be described with reference to FIGS. 1 to 3. Specifically, FIG. 1 is a circuit diagram showing a prior art semiconductor memory, FIG. 2 is a circuit diagram showing a pulse generator shown in FIG. 1, and FIG. 3 is a waveform diagram showing waveforms which appear in the operation of the prior art semiconductor memory.

Referring to FIG. 1, reference numeral 1 designates a memory cell, 2 a pair of digit lines, 3 a word line, 4 column selection switches, 5 write drivers, 6 precharging transistors, and 7 an equalizer transistor.

Reference numeral 8 designates a pulse generator which has a function of outputting a pulse at rising of the clock. This pulse generator 8 is constituted by a delay circuit 10 as shown in FIG. 2 (which shows an internal circuit of the pulse generator 8).

As for reference symbols used in FIGS. 1 to 3, CLK designates a clock signal, RC a recovery control signal, RW an input signal from a row decoder, CL a column selection signal, WE a write control signal, and DIN a data input.

Reference symbol WL designates a word line, D and -D (-D represents an inverted D as shown in FIGS. 1 and 3) a digit line pair, $R_1$ and $R_2$ memory cell load resistors, N and -N (-N represents an inverted N) memory cell nodes, $Tr_1$ and $Tr_2$ cell transfer transistors, and $Tr_3$ and $Tr_4$ cell driver transistors.

The operation of the prior art semiconductor memory will now be described with reference to the circuit diagrams of FIGS. 1 and 2 and the waveform diagram of FIG. 3.

With rising of the clock CLK, a pulse having a predetermined duration (see FIG. 3) is outputted as the recovery control signal RC from the pulse generator 8. As the clock CLK is used either an external clock input or an internal synchronizing signal which is obtained by detecting the transient of address and data input. The pulse width is set as desired by a delay circuit 10 shown in FIG. 2.

Upon pulse signal generation, the word line WL that is selected by a word selection signal (i.e., input signal RW from the row decoder) is held in this raised level for the time duration corresponding to the pulse width. At this time, the precharging transistors 6 and equalizing transistor 7 are turned off by the pulse signal (i.e., recovery control signal RC).

Also at this time, by the recovery control signal RC and write control signal WE, the circuit is made to be ready to write data, and one of the paired digit lines D and -D selected by the column selection signal CL is pulled down to a low level by the data input DIN, whereby data is written in the memory cell.

When the output signal (i.e., recovery control signal RC) from the pulse generator 8 is brought back to the low level again, the word line WL becomes non-selected, and the digit lines D and -D are recovered to the state before the write operation by the precharging transistors 6 and equalizing transistor 7 so as to be ready for the next read or write cycle.

As shown above, in the prior art semiconductor memory, the selection of the word line WL is controlled according to a pulse signal generated with a synchronizing signal, and it is thus possible to minimize the word line selection time and provide a sufficient time for the recovery of the digit lines D and -D after the write operation.

The word line selection time can be set as desired by appropriately setting the pulse width of the recovery control signal RC, provided that a sufficient time is given for the cell node to be inverted by the write operation and for this state to be stabilized.

The load resistors $R_1$ and $R_2$ used for the memory cell usually have high resistance, and high level voltage cannot be supplied to the cell nodes with current through the load resistors $R_1$ and $R_2$ even by bringing the word line WL to the non-selected state immediately after the cell inversion. Accordingly, even after the cell node potential inversion, the cell nodes are brought to a sufficient level by supplying voltage from the digit lines D and -D through the cell transfer transistors $Tr_1$ and $Tr_2$ before bringing the word line WL to the non-selected state.

In the above prior art semiconductor memory, however, pull-up of the digit lines and equalization are made after lowering the word line level in the write operation. This operation, however, has a drawback of prolonging the whole write cycle operation including the write operation until the stable inverted cell node state is reached after the word line level rising and until the digit line level recovery is completed.

Particularly, in the write operation, one of the paired digit lines D and -D has to be brought to the low level. The recovery time, therefore, is longer than the time for read operation, and ultimately influences the operation speed of the whole memory.

SUMMARY OF THE INVENTION

An object of the invention, therefore, is to overcome the problems existing in the prior art semiconductor memories, and to provide a semiconductor memory which is capable of reducing the cycle time compared to the prior art semiconductor memory described above, thus permitting fast operation.

According to the invention, the problems in the prior art semiconductor memories are solved by a semiconductor memory, in which the word line selection time is set to be from the clock rising till the stabilization of written high level after the memory cell inversion, and also the digit line level rising is caused immediately after the memory cell inversion.

Specifically, with the semiconductor memory according to the invention, it is possible to reduce the write cycle time compared to the prior art semiconductor memory to an extent corresponding to an overlap of the word line selection time and the digit line level recovery time.

According to one aspect of the invention, there is provided a semiconductor memory in which an activation period of a word line and a precharging period of digit lines are controlled using an internal pulse signal generated in synchronization with a clock signal, the semiconductor memory having means to divide the internal pulse signal into a first pulse signal and a second pulse signal respectively as a recovery control signal and a word line selection signal.

According to a second aspect of the invention, there is provided a semiconductor memory in which an activation period of a word line and a precharging period of digit lines are controlled using an internal pulse signal generated in synchronization with a clock signal, the semiconductor memory comprising a pulse generating circuit which divides the internal pulse signal into a first pulse signal and a second pulse signal respectively as a recovery control signal and a word line selection signal, the pulse generating circuit being configured such that the word line is activated while the first pulse signal is being generated and the digit lines is caused to be in a precharged state while the second pulse signal is not being generated so that the timing when the second internal pulse signal falls is earlier than the timing when the first pulse signal falls and that the digit lines are caused to be in the precharged state subsequent to memory cell node inversion in write operation.

In the semiconductor memory according to the invention, the word line selection time in the write operation is set to be from the clock rising till the stabilization of written high level after memory cell inversion, and the digit line recovery is caused immediately after the memory cell inversion. The write cycle time is thus made shorter compared to the prior art semiconductor memory in correspondence to the overlap of the word line selection time and the digit line recovery time, thus permitting fast operation.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Figure 4:
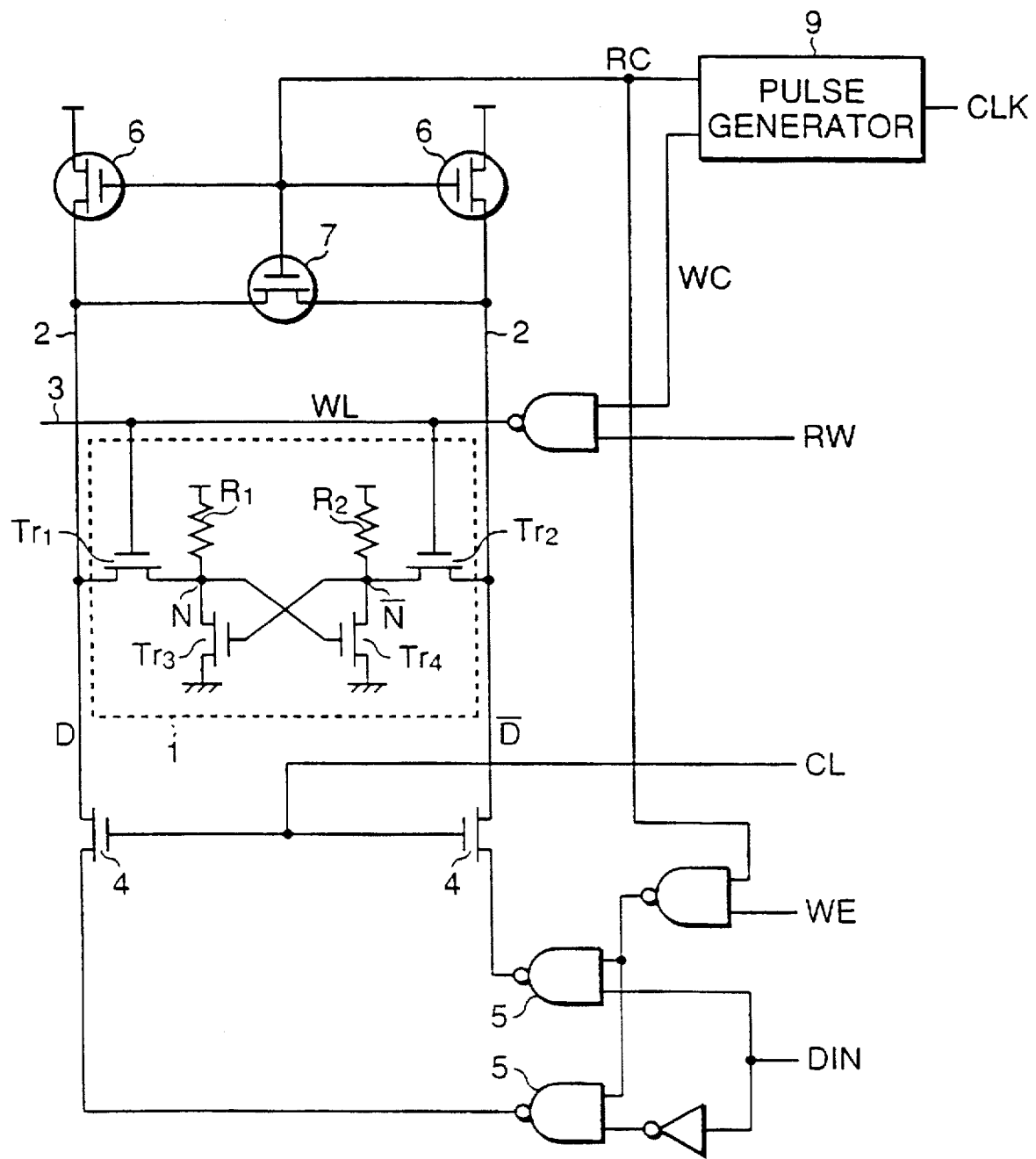
FIG. 4 is a circuit diagram showing a semiconductor memory of an embodiment according to the invention.

Now, an embodiment of the invention will be described with reference to FIGS. 4 to 6. FIG. 4 shows a diagrammatic circuit of an embodiment of the semiconductor memory according to the invention, FIG. 5 shows a diagrammatic circuit of a pulse generator shown in FIG. 4, and FIG. 6 shows waveforms which appear in the embodiment of the semiconductor memory according to the invention.

Referring to FIG. 4, reference numeral 1 designates a memory cell, 2 digit lines, 3 a word line, 4 column selection switches, 5 write drivers, 6 precharging transistors, and 7 an equalizing transistor.

Reference numeral 9 designates a pulse generator, which has a function of outputting pulses at rising of the clock. The pulse generator 9, as shown in FIG. 5 (i.e., circuit diagram of the pulse generator 9), includes a first delay circuit 11 and a second delay circuit 12 connected in series. The pulse generator 9 further includes an inverter 13 and two AND gates 14 and 15.

Figure 1:
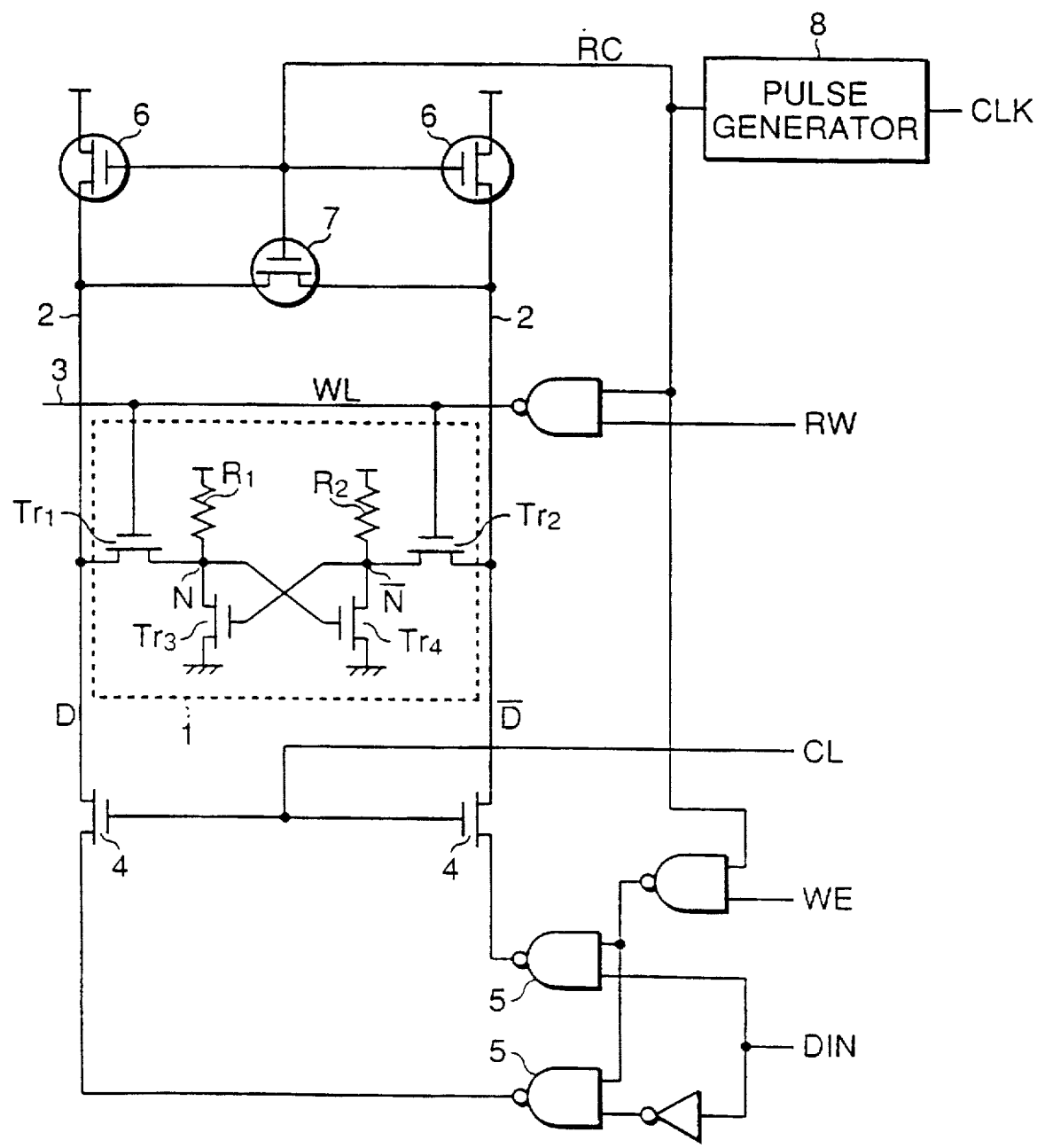
FIG. 1 is a circuit diagram showing a prior art semiconductor memory.
Figure 2:
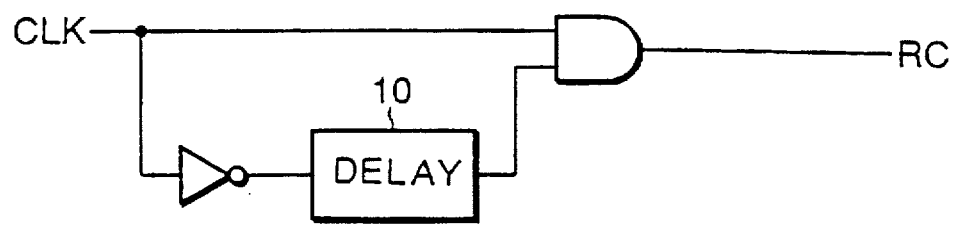
FIG. 2 is a circuit diagram showing a pulse generator shown in FIG. 1.
Figure 3:
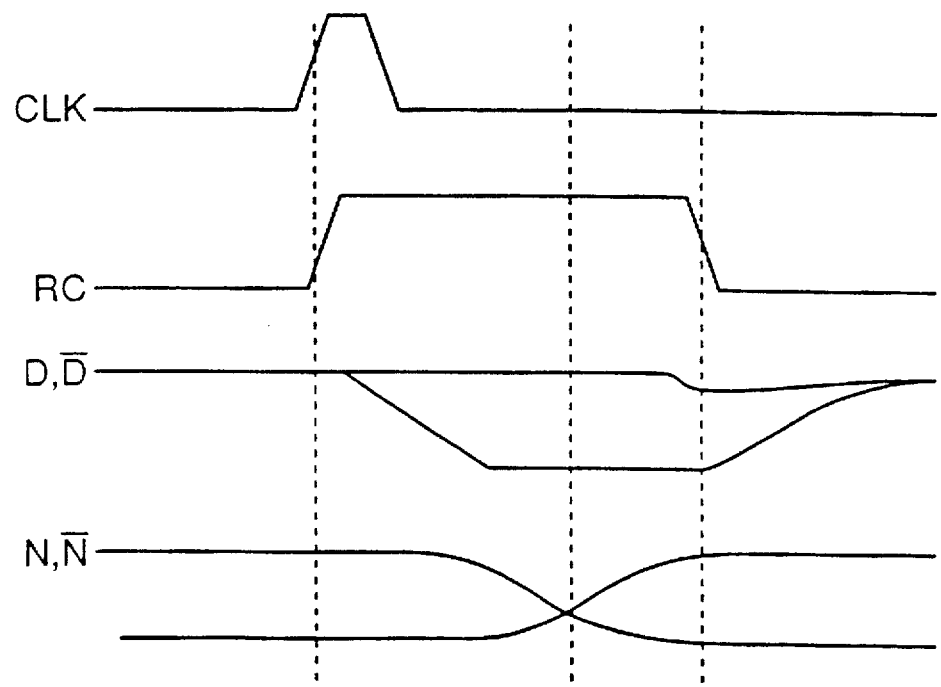
FIG. 3 is a waveform diagram showing waveforms which appear in the operation of the prior art semiconductor memory.
Figure 5:
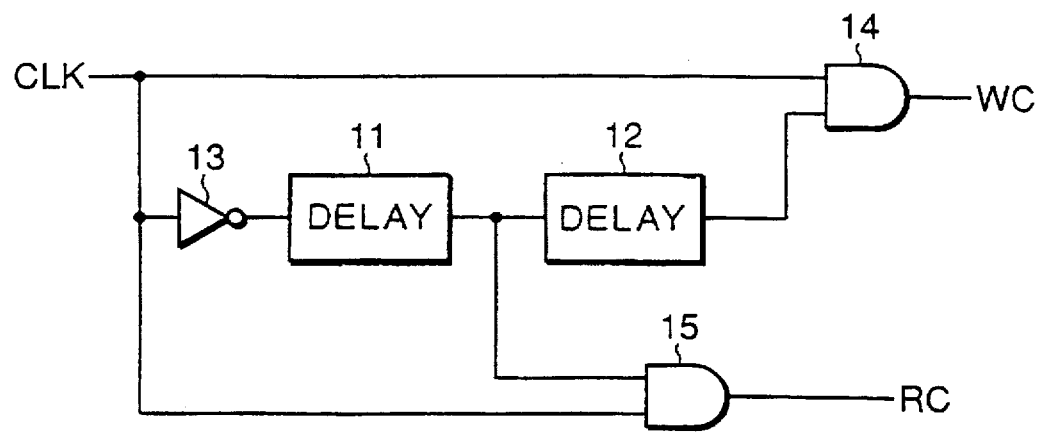
FIG. 5 is a circuit diagram showing a pulse generator shown in FIG. 4.
Figure 6:
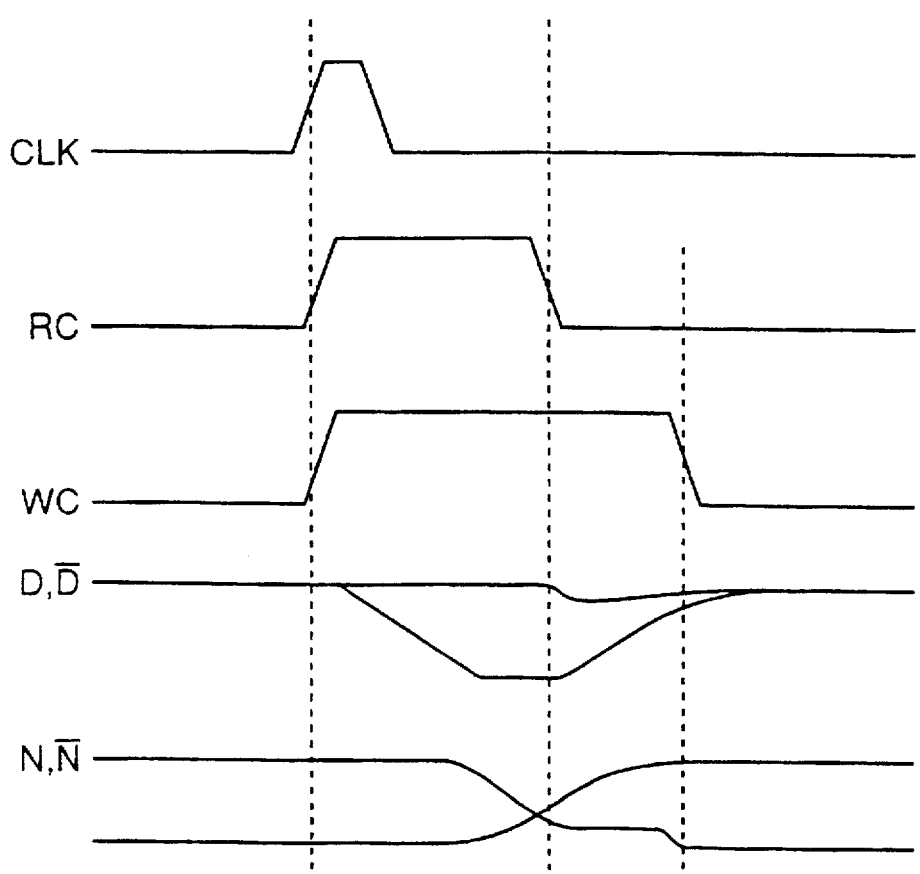
FIG. 6 is a waveform diagram showing waveforms which appear in the operation of the semiconductor memory of the embodiment according to the invention.

As for the reference symbols used in FIGS. 4 to 6, (reference symbols used here are the same as those used in FIGS. 1 to 3), CLK designates a clock signal, WC a word line selection signal, RC a recovery control signal, RW an input signal from a row decoder, i.e., word selection signal, CL a column selection signal, WE a write control signal, and DIN a data input.

Reference symbol WL designates a word line, D and -D (-D represents an inverted D as shown in FIGS. 4 and 6) a pair of digit lines, $R_1$ and $R_2$ memory cell load resistors, N and -N (-N represent an inverted N as shown in FIGS. 4 and 6) memory cell nodes, $Tr_1$ and $Tr_2$ cell transfer transistors, and $Tr_3$ and $Tr_4$ cell driver transistors.

The operation of the embodiment of the semiconductor memory according to the invention will now be described with reference to the circuit diagrams of FIGS. 4 and 5 and the waveform diagram of FIG. 6.

Referring to FIG. 4, upon input of the clock CLK, the pulse generator 9 produces an internal pulse signal and outputs the digit line recovery control signal RC and word line control signal WC separately. The clock signal is either an external clock input or an internal synchronizing signal obtained by detecting the transition of address and data input.

The delay circuits 11 and 12 are provided in series as shown in FIG. 5. They Correspond to the delay circuit 10 shown in FIG. 2 but the delay time is divided by them.

The pulse width of the digit line recovery control signal RC is determined by the delay time provided in the first delay circuit 11 shown in FIG. 5, while the pulse width of the word line selection signal WC is determined by the sum of the delay times provided by the first and second delay circuits 11 and 12.

The recovery control signal RC has a shorter pulse width by the time corresponding to the delay time in the second delay circuit 12. Thus, only the recovery operation starts earlier as compared with that in the prior art.

As already described in connection with the prior art semiconductor memory, the word selection time is determined by the time until the cell nodes are inverted in the write operation, and the high level side cell node after the write operation is brought to the potential that can be built up by voltage supplied from the digit lines through the cell transfer transistors $Tr_1$ and $Tr_2$, i.e., until the node level becomes the potential (Vcc–Vt) which is the difference between the digit line potential Vcc and the cell transfer transistor threshold voltage Vt. In addition, the recovery operation can be started immediately after the cell node inversion.

In the pulse generator shown in FIG. 5 in the embodiment of the invention, the delay time in the first delay circuit 11 is determined by the time from the clock input till the memory cell inversion, while the delay time in the second delay circuit 12 is determined by the time until the high level of the cell becomes (Vcc–Vt) after inversion of the cell.

Actually, the low level node of the cell after the write operation is sometimes in a slightly floating state, as shown in the waveform diagram of FIG. 6, because of the digit line recovery. However, the cell driver transistors Tr₃ and Tr₄ are turned off due to rising of the opposite side node potential so that the cell data is not destroyed.

The operation of the semiconductor memory according to the invention will be further described. It is obvious from the description so far that the semiconductor memory according to the invention operates normally.

Upon pulse signal generation, the word line WL that has been selected by the word selection signal RW is caused to be held in the rise state for the pulse width of the word line selection signal WC. At this time, the precharging transistors 6 and equalizing transistor 7 are turned off by the digit line recovery control signal RC. In addition, by the digit line recovery control signal RC and write control signal WE, the circuit is made to be ready to write data. In this state, one of the paired digit lines D and -D that has been selected by the column selection signal CL is brought to low level by the data input DIN. In this way, data is written in the memory cell.

When the digit line recovery signal RC is brought back to the low level again, the digit lines are recovered by the precharging transistors 6 and equalizing transistor 7. However, as described before, the word line is held in the selected state until the memory cell nodes are stabilized.

Toward the memory cell node potential stabilization, the word line is brought to the non-selected state by the word line selection signal WC, and the state before the write operation is restored by the recovery of the digit lines to be ready for the next read or write cycle.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory device in which an activation period of a word line and precharging period of digit lines are controlled using an internal pulse signal generated in synchronization with a clock signal, said semiconductor memory device having an internal pulse signal generator which receives said clock signal, divides said internal pulse signal and outputs a first pulse signal and a second pulse signal, respectively, as a recovery control signal for controlling said precharging period of said digit lines and a word line selection signal for controlling said activation period of said word line, said pulse signal generator comprising a first delay circuit and a second delay circuit connected in series, said first delay circuit providing a delay time for a pulse width of said recovery control signal, and said second delay circuit together with said first delay circuit providing a delay time for a pulse width of said word line selection signal.

2. A semiconductor memory device, comprising:

a memory cell to which a word line and a pair of digit lines are connected; and a pulse signal generator which divides an internal signal and produces, in synchronization with a clock signal, a first and a second pulse signal for controlling an activation period of said word line and a precharging period of said digit lines such that said word line is activated while said first pulse signal is being generated and said digit lines are precharged while said second pulse signal is not being generated, said second pulse signal falling earlier than said first pulse signal such that said pair of digit lines are caused to be in a precharged state subsequent to memory cell node inversion in a write operation, said pulse signal generator comprising:

an inverter having an input node for receiving said clock signal;

a first delay circuit having an input node connected to an output node of said inverter;

a second delay circuit having an input node connected to an output node of said first delay circuit;

a first AND gate having a first input node for receiving said clock signal, a second input node connected to an output node of said second delay circuit, and an output node for outputting said first pulse signal; and a second AND gate having a first input node connected to the output node of said first delay circuit, a second input node for receiving said clock signal, and an output node for outputting said second pulse signal.

* * * * *